United States Patent
Shirota et al.

[11] Patent Number: 6,151,249
[45] Date of Patent: Nov. 21, 2000

[54] NAND-TYPE EEPROM HAVING BIT LINES AND SOURCE LINES COMMONLY COUPLED THROUGH ENHANCEMENT AND DEPLETION TRANSISTORS

[75] Inventors: Riichiro Shirota, Kawasaki; Masaki Momodomi, Yokohama, both of Japan

[73] Assignee: Kabushiki Kaisha Toshiba, Kawasaki, Japan

[21] Appl. No.: 08/210,288

[22] Filed: Mar. 18, 1994

[30] Foreign Application Priority Data

Mar. 19, 1993 [JP] Japan .................................... 5-060558

[51] Int. Cl.[7] .................................... G11C 16/04
[52] U.S. Cl. .................................... 365/185.17; 365/185.02; 365/103; 365/104; 257/314; 257/315
[58] Field of Search .................................... 365/185, 189.09, 365/230.03, 900, 103, 104, 185.02, 185.17; 257/314, 315

[56] References Cited

U.S. PATENT DOCUMENTS

| | | | |
|---|---|---|---|
| 4,962,481 | 10/1990 | Choi et al. | 365/185 |
| 4,980,861 | 12/1990 | Herdt et al. | 365/203 |
| 5,043,942 | 8/1991 | Iwata et al. | 365/185.23 |
| 5,050,125 | 9/1991 | Momodomi et al. | 365/185.17 |
| 5,111,428 | 5/1992 | Liang et al. | 365/104 |
| 5,253,206 | 10/1993 | Tanaka et al. | 365/189.09 |

FOREIGN PATENT DOCUMENTS

| | | |
|---|---|---|
| 2-74069 | 3/1990 | Japan . |
| 2-83971 | 3/1990 | Japan .................................... 365/185 |
| 2-177199 | 7/1990 | Japan . |

OTHER PUBLICATIONS

"Densely arrayed EEPROM having low–voltage tunnel write", E. Adler, IBM TDB, vol. 27, No. 6, Nov. 1984, pp. 3302–3307.

*Primary Examiner*—Andrew Q. Tran
*Attorney, Agent, or Firm*—Oblon, Spivak, McClelland, Maier & Neustadt, P.C.

[57] ABSTRACT

In an EEPROM including a plurality of NAND memory cells each constituted by connecting memory cells each having a floating gate and a control gate in series with each other, first selection transistors respectively coupled between the same bit line and terminals, on one side, of each pair constituted by two NAND memory cells of the plurality of memory cells, and second selection transistors respectively coupled between terminals on the other side and source lines (SL), the first or second selection transistors are constituted by an enhancement transistor and a depletion transistor which are coupled in series with each other, and the arrangements of the depletion transistor and enhancement transistor of the first selection transistors are reversed to those of the second selection transistors in the same NAND memory cells.

16 Claims, 5 Drawing Sheets

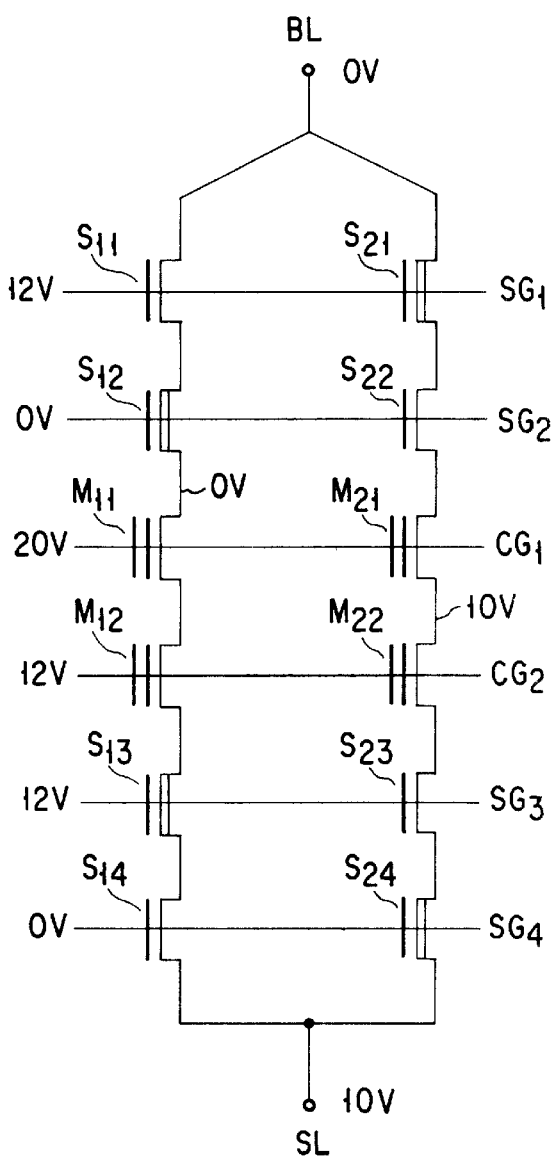
F I G. 2

NAND-TYPE EEPROM HAVING BIT LINES AND SOURCE LINES COMMONLY COUPLED THROUGH ENHANCEMENT AND DEPLETION TRANSISTORS

BACKGROUND OF THE INVENTION

1. Field of the Invention

The present invention relates to a nonvolatile semiconductor memory device (EEPROM) using electrically programmable memory cells each having a charge accumulation layer such as a floating gate and a control gate and, more particularly, to an EEPROM having a memory cell array having a NAND cell arrangement.

2. Description of the Related Art

As one of conventional EEPROMs, a NAND EEPROM which can be integrated at a high density is known. In the NAND EEPROM, a plurality of memory cells are coupled in series with each other such that the source and drain of adjacent memory cells are commonly used for the memory cells, and the coupled memory cells are defined as one unit coupled to a bit line. This one unit is defined as a NAND cell. Each memory cell generally has a MOS structure obtained by stacking a floating gate and a control gate. The drain side of each NAND cell is coupled to the bit line through a selection gate, and the source side is coupled to a source line (reference potential wiring line) through a selection gate. The control gates of the memory cells are sequentially arranged in a row direction to become word lines.

In recent years, as an improved NAND EEPROM, an EEPROM in which the number of contacts between bit lines and drains is decreased by improving a selection gate is proposed (Jpn. Pat. Appln. KOKAI Publication No. 2-74069). This EEPROM is constituted as follows. A bit line is coupled to a drain diffusion layer through a drain contact hole, and two first selection transistor arrays are arranged to be coupled to the drain diffusion layer. The first selection transistors are constituted by properly connecting an enhancement transistor in series with a depletion transistor, a source line is arranged perpendicular to the bit line, and one second selection transistor array is arranged to be coupled to the source line. A plurality of cell transistors each having a floating gate and a control gate are coupled in series with the two first selection transistor arrays and the second selection transistor array.

With the above arrangement, only one bit line and one drain contact are required for the two adjacent NAND cell arrays, and the number of bit lines and the number of drain contact holes can be decreased to increase a degree of integration in the word line direction.

In the above device, data is erroneously written in a data write operation. This problem will be described below with reference to FIG. 1.

In an EEPROM shown in FIG. 1, in a data write operation, the potential of a bit line BL is set to be 0 V, a gate potential $SG_1$ of first selection transistors is set at "H", $SG_2=0$ V, a gate potential $SG_3$ of second selection transistors is set to be 0 V, a control gate potential $CG_1$ on a drain contact side from a memory cell in which data is to be written is set to be 20 V, and a control gate potential $CG_2$ of other memory cells is set to be 0 V.

In this case, the left transistor of the first selection transistors is turned on, the right transistor is turned off, and both the second selection transistors are turned off. Since the drain and gate of the memory cell in which data is to be written are set to be 0 V and 20 V, respectively, electrons are extracted to the drain from the floating gate of the memory cell to change the threshold voltage of the memory cell. That is, a write operation is performed to the memory cell. Since a source/drain diffusion layer is set in a floating state in the right NAND cell, even when the control gate of the memory cell on the drain contact side from the memory cell in which data is to be written is set to be 20 V, no electrons are injected into the memory cell. Therefore, the threshold voltage of the memory cell does not change.

However, in practical use, when a substrate temperature is at a temperature, e.g., 20 to 80°, pairs of electrons and holes are easily generated in an Si substrate, in the memory cell to which the control gate is set to the potential 20 V, electrons generated in the substrate due to the above pairs are injected into the floating gate, thereby changing the threshold voltage. That is, an erroneous write operation is performed in the memory cell. This change in threshold voltage is caused by, e.g., crystal defects. The change may occur even in at room temperature. Therefore, although a process free from crystal defects is required, a process margin must be decreased to realize this process.

As described above, in a conventional EEPROM in which one bit line and one drain contact are used in two NAND cell arrays, the source and drain of each non-selected memory cell are set in a floating state. For this reason, electrons generated by a substrate are injected into the floating gate to cause an erroneous write operation.

SUMMARY OF THE INVENTION

It is an object of the present invention to provide an EEPROM in which, even when one bit line and one drain contact are used in two NAND memory cell arrays, an erroneous operation caused by injecting electrons in a memory cell in which data is not to be written can be prevented, and reliability can be improved.

A nonvolatile semiconductor memory device according to the present invention is characterized by comprising: a plurality of NAND cells having first and second terminals and constituted by connecting a plurality of memory cells each having a control gate in series with each other, the NAND memory cells including adjacent first and second NAND memory cells; bit lines commonly used for NAND memory sets each constituted by at least the first and second NAND memory cells of the NAND memory cells, bit lines being coupled to the first terminals of the NAND memory cells; source lines commonly used for the NAND memory sets each constituted by at least the first and second NAND memory cells of the NAND memory cells, source lines being coupled to the second terminals of the NAND memory cells; first selection transistors arranged between the first terminal of the first NAND memory cell and the bit line; second selection transistors arranged between the first terminal of the second NAND memory cell and the bit line; third selection transistors arranged between the second terminal of the first NAND memory cell and the source line; fourth selection transistors arranged between the second terminal of the second NAND memory cell and the source line; a first gate line coupled to at least gates of the first selection transistors; a second gate line coupled to at least gates of the second selection transistors; a third gate line coupled to at least gates of the third selection transistors; and a fourth gate line coupled to at least gates of the fourth selection transistors.

In the above construction, one of the first and second selection transistors include an enhancement transistor and one of the third and fourth selection transistors include an enhancement transistor. Further, in the above construction, each of the first to fourth selection transistors includes an enhancement transistor and a depletion transistor which are coupled in series with each other; the first gate line is coupled to a gate of the enhancement transistor of the first selection transistors and a gate of the depletion transistor of the second selection transistors; the second gate line is coupled to a gate of the enhancement transistor of the second selection transistors and a gate of the depletion transistor of the first selection transistors; the third gate line is coupled to a gate of the enhancement transistor of the third selection transistors and a gate of the depletion transistor of the fourth selection transistors; and the fourth gate line is coupled to a gate of the enhancement transistor of the fourth selection transistors and a gate of the depletion transistor of the third selection transistors.

The nonvolatile semiconductor memory device according to the present invention is characterized by further comprising: potential applying means including control gate potential applying means for setting a potential of the gate of the memory cell in which data is to be written to be a first potential, bit line potential applying means for setting a potential of the bit line to be any one of a second potential lower than the first potential or a third potential lower than the second potential in accordance with the data to be written, and source line potential applying means for setting potentials of the source lines to be an intermediate potential between the first potential and the third potential, when data is to be written in a memory cell; and one of means for, when data is to be written in a memory cell included in the first NAND memory cell, turning on the first and fourth selection transistors and turning off the second and third selection transistors, and for, when data is to be written in a memory cell included in the second NAND memory cell, turning on the second and third selection transistors and turning off the first and fourth selection transistors. The first and second selection transistors are characterized by including first and second drain layers, respectively, the first and second drain layers being arranged parallel to each other in a form of stripes, and which further comprising a bit line contact formed across the first and second drain layers and coupled to the first and second drain layers and means for, when data is to be written in a memory cell included in the first NAND memory cell, turning on the first and fourth selection transistors and turning on the second and third selection transistors, and for, when data is to be written in a memory cell included in the second NAND memory cell, turning off the second and third selection transistors and turning on the first and fourth selection transistors. The first and second selection transistors are characterized by including first and second drain layers, respectively, the first and second drain layers being arranged parallel to each other in a form of stripes, and which further comprising a bit line contact formed across the first and second drain layers and coupled to the first and second drain layers.

A nonvolatile semiconductor memory device is characterized by comprising: a plurality of NAND memory cells each having first and second terminals and constituted by connecting a plurality of memory cells each having a control gate in series with each other, each of the NAND memory cells including adjacent first and second NAND memory cells; bit lines commonly used for NAND memory sets each constituted by at least the first and second NAND memory cells of the NAND memory cells, bit lines being coupled to the first terminals of the NAND memory cells; source lines commonly used for the NAND memory sets each constituted by at least the first and second NAND memory cells of the NAND memory cells, source lines being coupled to the second terminals of the NAND memory cells; first selecting means arranged between the first terminals of the first and second NAND memory cells and the bit line; and second selecting means arranged between the second terminals of the first and second NAND memory cells and the source line; wherein the first selecting means include enhancement transistors and depletion transistors which are coupled in series with each other, connection orders of the enhancement transistors and the depletion transistors to the first terminals of the first and second NAND memory cells are reversed to each other, and the second selecting means include enhancement transistors and depletion transistors which are coupled in series with each other, and connection orders of the enhancement transistors and the depletion transistors to the second terminals of the first and second NAND memory cells are reversed to each other.

The nonvolatile memory device according to the present invention is characterized by further comprising: means for, when data is to be written in a memory cell, setting a potential of the gate of the memory cell in which data is to be written to be a first potential, setting a potential of the bit line to be any one of a second potential lower than the first potential or a third potential lower than the second potential in accordance with the data to be written, and setting potentials of the source lines to be an intermediate potential between the first potential and the third potential; and means for, when data is to be written in a memory cell included in the first NAND memory cells, turning on the first selecting means coupled to the first NAND memory cell and the second selecting means coupled to the second NAND memory cell and turning off the first selecting means coupled to the second NAND memory cell and the second selecting means coupled to the first NAND memory cell, and for, when data is to be written in a memory cell included in the second NAND memory cells, turning off the first selecting means coupled to the first NAND memory cell and the second selecting means coupled to the second NAND memory cell and turning on the first selecting means coupled to the second NAND memory cell and the second selecting means coupled to the first NAND memory cell. The first and second selecting means are characterized by including first and second drain layers, respectively, the first and second drain layers being arranged parallel to each other in a form of stripes, and the nonvolatile memory device is characterized by further comprising a bit line contact formed across the first and second drain layers and coupled to the first and second drain layers.

According to the present invention, in a NAND memory cell without including one of memory cell (selected cell) in which data is to be written, in two NAND memory cell arrays, second selection transistors are turned on not to set the source/drain diffusion layer in a floating state but to transfer a source potential to the source/drain diffusion layer. Second selecting means are constituted by a series circuit obtained by connecting two transistors, i.e., enhancement and depletion transistors, and in a NAND memory cell including no memory cell (selected cell) in which data is to be written, the second selecting means are turned on not to set the source/drain diffusion layer of a non-selected cell coupled to a word line coupled to the selected cell in a floating state but to transfer a source potential to the source/drain diffusion layer. Therefore, when the potential of the source line is set to be sufficiently high in a write operation, electrons generated on a substrate side can be prevented from being injected into a floating gate to prevent an erroneous write operation.

According to the present invention, first or second selection transistors are constituted by a series circuit obtained by connecting two transistors, i.e., enhancement and depletion transistors, and in a NAND memory cell including no memory cell (selected cell) in which data is not to be written, the second selection transistors is turned on not to set the source/drain diffusion layer of a non-selected cell coupled to a word line coupled to the selected in a floating state but to make the potential of the source/drain diffusion layer coincide with a source potential, thereby preventing electrons from being injected into the memory cell in which data is not to be written. For this reason, integration in a bit line direction can be easily performed, and an erroneous write operation can be prevented, thereby improving reliability.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a circuit diagram showing the basic arrangement of the present invention;

DETAILED DESCRIPTION OF THE PREFERRED EMBODIMENTS

Figure 1:
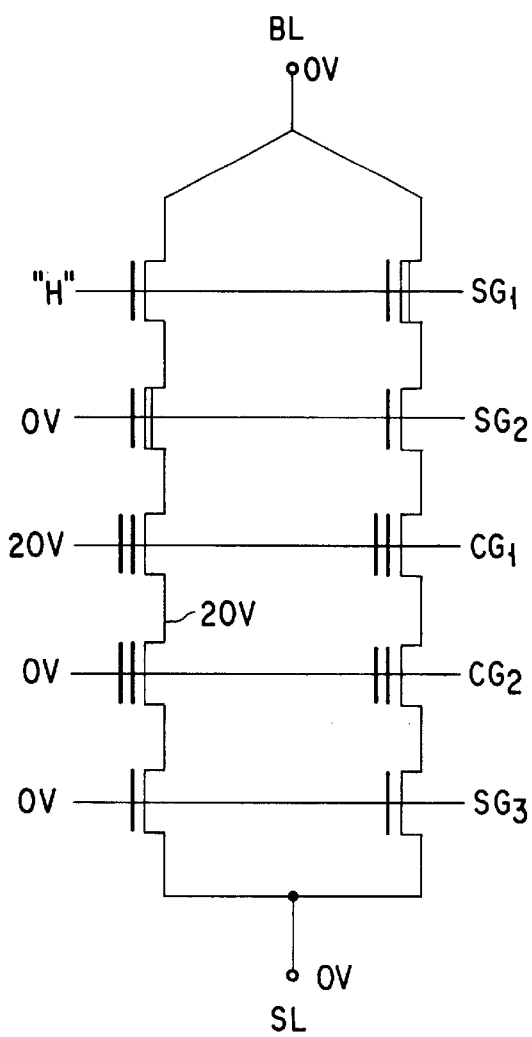
FIG. 1 is a view showing a circuit arrangement for explaining an operation of a conventional EEPROM.

The basic principle of the present invention will be described below with reference to FIG. 2 prior to the explanation of the embodiments. FIG. 2 is a circuit diagram showing the basic arrangement of the present invention.

Two first selection transistor arrays are coupled to a bit line BL, and two second selection transistor arrays are coupled to a source line SL.

In the left array, the first selection transistors are constituted by connecting an enhancement (to be referred to as an E-type hereinafter) transistor $S_{11}$ and a depletion (to be referred to as a D-type hereinafter) transistor $S_{12}$ in series with each other, and the second selection transistors are constituted by connecting a D-type transistor $S_{13}$ and an E-type transistor $S_{14}$ in series with each other.

In the right array, the first selection transistors are constituted by connecting a D-type transistor $S_{21}$ and an E-type transistor $S_{22}$ in series with each other, and the second selection transistors are constituted by an E-type transistor $S_{23}$ and a D-type transistor $S_{24}$ in series with each other.

Memory cells $M_{11}$ and $M_{12}$ each having a floating gate and a control gate are coupled in series with each other between the first and second transistors of the left array. Memory cells $M_{21}$ and $M_{22}$ are coupled in series with each other between the first and second selection transistors of the right array.

In a data write operation, the bit line BL is set to be 0 V, gate potentials $SG_1$ and $SG_2$ of the first selection transistors are set to be 12 V and 0 V, respectively, potentials $SG_3$ and $SG_4$ of the second selection transistors are set to be 12 V and 0 V, respectively, a control gate potential $CG_1$ of the memory cell $M_{11}$ subjected to write access is set to be 20 V, and a control gate potential $CG_2$ of the memory cell $M_{12}$ is set to be 12 V.

In this case, the first selection transistors of the left array are turned on, and the first selection transistors of the right array are turned off; the second selection transistors of the left array are turned off, and the second selection transistors of the right array are turned on. Since the drain potential and control gate potential of the memory cell $M_{11}$ subjected to write access are set to be 0 V and 20 V, respectively, electrons are injected into the floating gate of the memory cell $M_{11}$, and the threshold voltage of the memory cell $M_{11}$ changes. That is, a write operation for the memory cell $M_{12}$ is performed. On the other hand, since the second transistors are set in an ON state, the source/drain diffusion layer of the right memory cell $M_{21}$ is not set in a floating state but has a potential of 10 V, and the memory $M_{21}$ has a potential difference between the source/drain diffusion layer and the gate smaller than that of the memory cell $M_{11}$. In the memory having such a small potential difference, no electrons are injected into the floating gate, and a write operation is not performed. That is, an erroneous write operation for the memory cell $M_{12}$ is prevented.

The present invention will be described below in detail with reference to the accompanying drawings.

Figure 3:
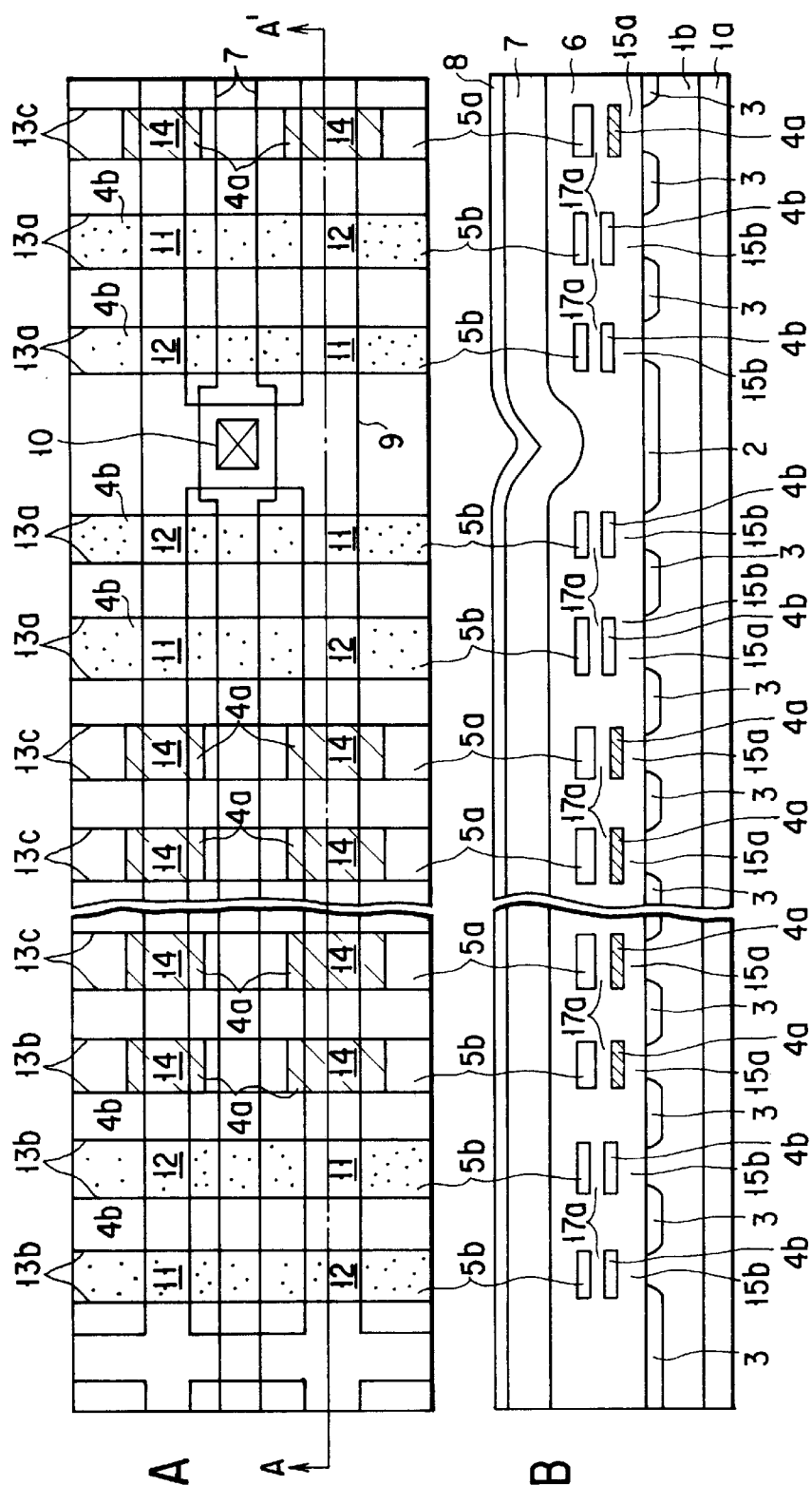
FIGS. 3A and 3B are respectively plan and sectional views showing the element arrangement of an EEPROM according to an embodiment of the present invention.
Figure 4:
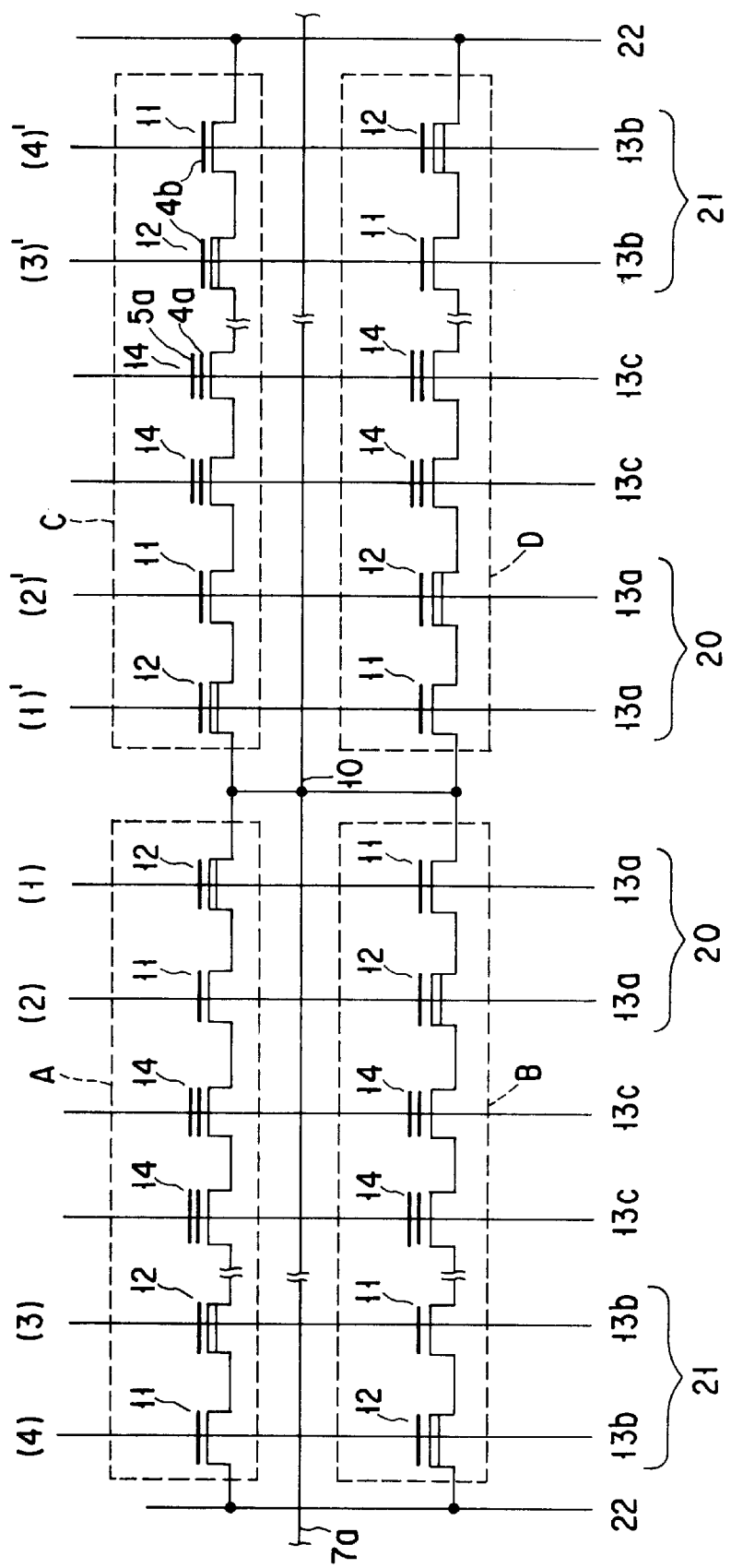
FIG. 4 is a view showing the circuit arrangement of an EEPROM according to the embodiment.

FIGS. 3A, 3B, and 4 are views for explaining an EEPROM according to an embodiment of the present invention, in which FIG. 3A is a plan view (obtained by viewing a cell array from the upper direction), FIG. 3B is a sectional view showing the cell array along a line A-A', and FIG. 4 is a view showing the circuit arrangement of the cell array shown in FIGS. 3A and 3B.

Referring to FIGS. 3A and 3B, a well 1b of a conductivity type opposite to that of an Si substrate 1a is formed on the substrate 1a. A drain diffusion layer 2 of a contact portion and source/drain diffusion layers 3 are formed in the surface of the well 1b. Floating gates 4a (charge accumulation layers) consisting of polysilicon are formed on the well 1b through a gate oxide film 15a consisting of $SiO_2$, and control gates 5a consisting of polysilicon are formed on the floating gates 4a through a silicon oxide film 17a consisting of $SiO_2$. Control gates 4b consisting of polysilicon are formed on the well 1b through a gate oxide film 15b, for a selection transistor, consisting of $SiO_2$, and wiring layers 5b consisting of polysilicon are formed on the control gates 4b through the silicon oxide film 17a consisting of $SiO_2$.

The surface of the substrate on which these gates 4a, 4b, 5a, and 5b are formed is covered with an insulating interlayer 6 consisting of $SiO_2$, and a wiring layer 7 consisting of Al is formed on the insulating interlayer 6. This wiring layer 7 functions as a bit line 7a. The substrate surface on which the wiring layer 7 is formed is covered with a cover film 8 consisting of PSG.

Referring to FIG. 3A, a memory cell array is isolated by a field oxide film 9 consisting of, e.g., $SiO_2$, and the memory cell array is coupled to the wiring layer 7 serving as the bit line through a drain contact hole 10. The source/drain diffusion layers 3, the control gates 5a, and the like constitute E-type transistors 11, D-type transistors 12, and cell transistors 14. In addition, the device according to the present invention has word lines 13a of the gate electrodes for the first selection transistors, word lines 13b of the gate electrodes for the second selection transistors, and word lines 13c of the control gate electrodes of memory cells.

The circuit shown in FIG. 4 is constituted by the element structure described above.

A bit line 7a is coupled to a drain diffusion layer through the drain contact hole 10, two first selection transistors arrays 20 are arranged to be coupled to the drain diffusion layer, and source lines 22 are arranged perpendicular to the bit line 7a. The second selection transistor arrays 21 are arranged to be coupled to the source lines 22, and NAND cells obtained by connecting a plurality of cell transistors 14 in series with each other are arranged between the two selection transistor arrays 20 and the two selection transistor arrays 21.

Each of the first and second selection transistor arrays 20 and 21 is constituted by connecting the E-type transistor 11 and the D-type transistor 12 in series with each other, and the arrangement of the E-type transistors and D-type transistors are arranged as shown in FIG. 4.

A method of manufacturing an EEPROM according to this embodiment will be described below with reference to FIGS. 5A to 5C.

Figure 5A:
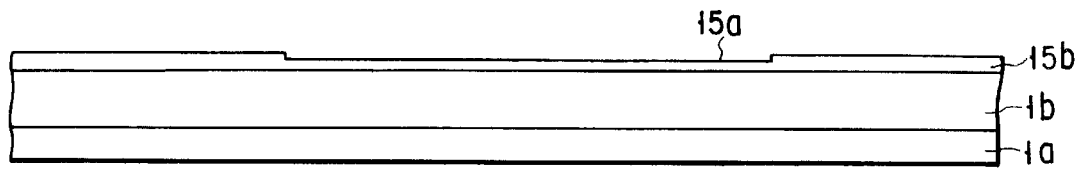
FIGS. 5A to 5C are sectional views showing the steps in manufacturing an EEPROM according to the embodiment.

As shown in FIG. 5A, the well 1b of a conductivity type opposite to that of the substrate 1a is formed on the surface of the substrate 1a, and a field isolation region is formed. At this time, the field oxide film region 9 shown in FIG. 3A becomes an insulating region.

Ion implantation for the channels of the cell transistors is performed in the cell transistor region of the well 1b, and ion implantation for the channels of the E-type transistors 11 and the D-type transistors 12 is performed in a selection transistor region. The gate oxide film 15b is formed by a thermal oxidation method, and only the gate oxide film 15b of a region corresponding to the memory cell transistor portion is selectively etched. Thereafter, the gate oxide film 15a for the memory cell transistors is formed by the thermal oxidation method. The gate oxide film 15b becomes a gate oxide film for the selection transistors.

Figure 5B:
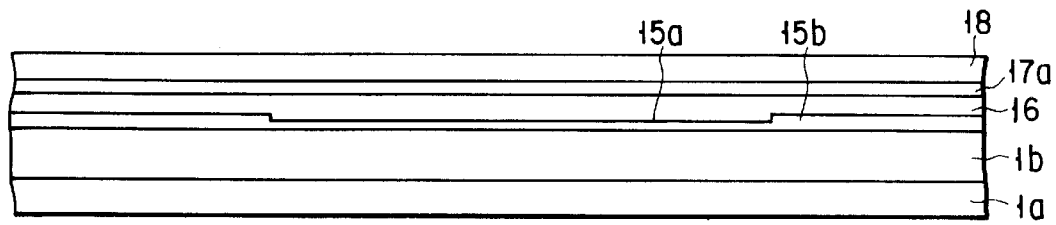

As shown in FIG. 5B, polysilicon is deposited on the gate oxide films 15a and 15b by a CVD method, and an unnecessary portion of the polysilicon film is selectively etched by an RIE method, thereby forming a first polysilicon film 16. The first polysilicon film 16 is oxidized by a thermal oxidation method to form the silicon oxide film 17a, and polysilicon is deposited on the silicon oxide film 17a to cover the entire surface of the silicon oxide film 17a to form a second polysilicon film 18.

Figure 5C:
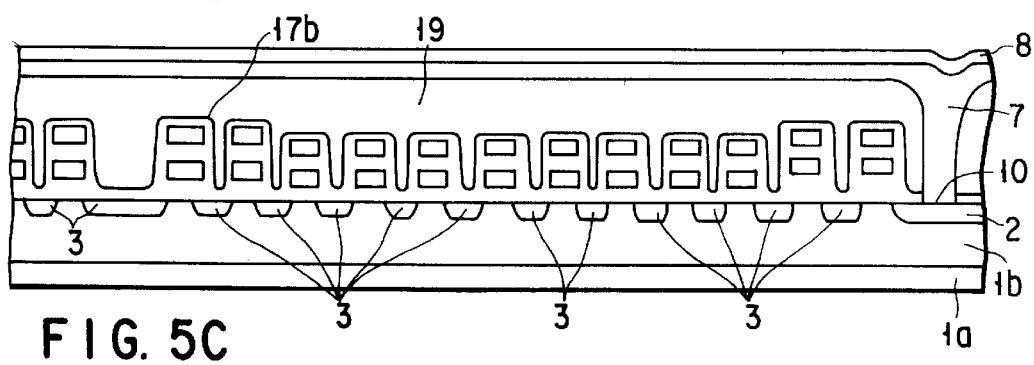

As shown in FIG. 5C, the second polysilicon film 18 is selectively patterned, and the first polysilicon film 16 is patterned in a self-aligned manner. At this time, the first polysilicon film 16 serves as the floating gate 4a of each cell transistor, and the second polysilicon film 18 formed on the first polysilicon film 16 through the silicon oxide film 17a serves as the control gate 5a. The first polysilicon film 16 formed on the gate oxide film 15b serves as the gates 4b of the E- and D-type transistors 11 and 12.

The gates 4b of the E- and D-type transistors 11 and 12 are brought into contact with the wiring layer 5b consisting of polysilicon at predetermined positions of the cell array to decrease the resistance of the gates 4b.

The first and second polysilicon films 16 and 18 are oxidized by a thermal oxidation method to form a silicon oxide film 17b, and the drain diffusion layer 2 and the source/drain diffusion layers 3 are formed by an ion implantation method. A passivation film 19 is formed by a CVD method to entirely cover the resultant structure.

The passivation film 19 and the gate oxide film 15b on the drain diffusion layer 2 are selectively etched to form the drain contact hole 10, and Al is deposited on the entire surface of the resultant structure by a sputtering method to form the wiring layer 7 such that the wiring layer 7 is in contact with the drain diffusion layer 2 through the drain contact hole 10. The cover film 8 is formed by a CVD method to cover the entire surface of the wiring layer 7, thereby completing the EEPROM shown in FIGS. 3A, 3B, and 4.

As described above, in the device according to this embodiment, as shown in FIGS. 3A, 3B, and 4, the bit line 7a is coupled to the drain diffusion layer 2 through the drain contact hole 10, the first selection transistor arrays 20 are arranged with respect to one bit line 7a to be coupled to the drain diffusion layer 2, and the first selection transistor arrays 20 are obtained by properly connecting the E-type transistors 11 and the D-type transistors 12 in series with each other. In addition, in the device according to this embodiment, the second selection transistor arrays 21 are arranged to be coupled to the source line 22, and the plurality of cell transistors 14 each having the floating gate 4a and the control gate 4b are coupled in series with each other so as to connect the first selection transistor arrays to the second selection transistor arrays 21.

According to the present invention, the bit line 7a is commonly used for the diffusion layers 2 and 3 of the plurality of cell transistors 14 arranged in the two arrays and adjacent to each other through the field isolation region 9, and the number of bit lines 7a can be half that used in a conventional scheme. Therefore, the line width of each of the bit lines 7a and the line interval between the bit lines 7a can be twice those used in the conventional scheme, respectively. For this reason, a decrease in yield caused by line disconnection and short-circuiting between the bit lines can be prevented.

The operational principle of the EEPROM according to this embodiment will be described below with reference to FIG. 4.

In this embodiment, the two first selection transistor arrays 20 on the drain contact hole 10 side are constituted by properly connecting the E-type transistors 11 and the D-type transistors 12 in series with each other, and the two second selection transistor arrays 21 on the source line side are properly constituted by connecting the E-type transistors 11 and the D-type transistors 12 in series with each other, and the plurality of cell transistors 14 arranged in two arrays are coupled to the first and second selection transistor arrays 20 and 21. In this state, the plurality of memory cell transistors and a plurality of selection transistor arrays A, B, C, and D need only be selected.

That is, the bit line 7a is set at "H", lines (2), (1)', and (2)' are set to be 0 V to turn off the E-type transistors 11 coupled to these lines, and a line (1) is set at "H" to turn on the E-type transistor 11 coupled to the line (1) (the D-type transistors 12 are always set in an ON state). In this case, only the array B is selected, the potential of the bit line 7a is transferred to the array B, and other arrays are decoupled from the bit line 7a.

Similarly, when a line (2) is set at "H", and other lines are set to be 0 V, the array A is selected. When the line (1)' is set at "H", and other lines are set to be 0 V, the array D is selected. When the line (2)' is set at "H", and other lines are set at 0 V, the array C is selected.

When lines (3)' and (4)' are set to be 0 V to turn off the E-type transistors 11 coupled to these lines, and a line (3) is set at "H" to turn on the E-type transistor 11 coupled to the line (3) (the D-type transistors 12 are always set in an ON state), only the array B is selected. In this case, the potential of the source line 22 is transferred to the array B, and other arrays are decoupled from the source line 22. Similarly, when a line (4) is set at "H", and other lines are set to be 0 V, the array A is selected. When the line (3)' is set at "H", and the other lines are set to be 0 V, the array D is selected. When the line (4)' is set at "H", and other lines are set to be 0 V, the array C is selected.

In a data write operation, when the array A is selected, the lines (2) and (3) are set at "H". The array A is coupled to the bit line 7a and decoupled from the source line 22, and the array B is decoupled from the bit line 7a and coupled to the source line 22.

The principle of erase, write, and read operations according to this embodiment will be described below with reference to FIG. 6. Assume that the cell transistors 14 of the portions $M_1$ and $M_2$ indicated by dotted lines in FIG. 6 are simultaneously selected to perform write, erase, and read operations.

Figure 6:
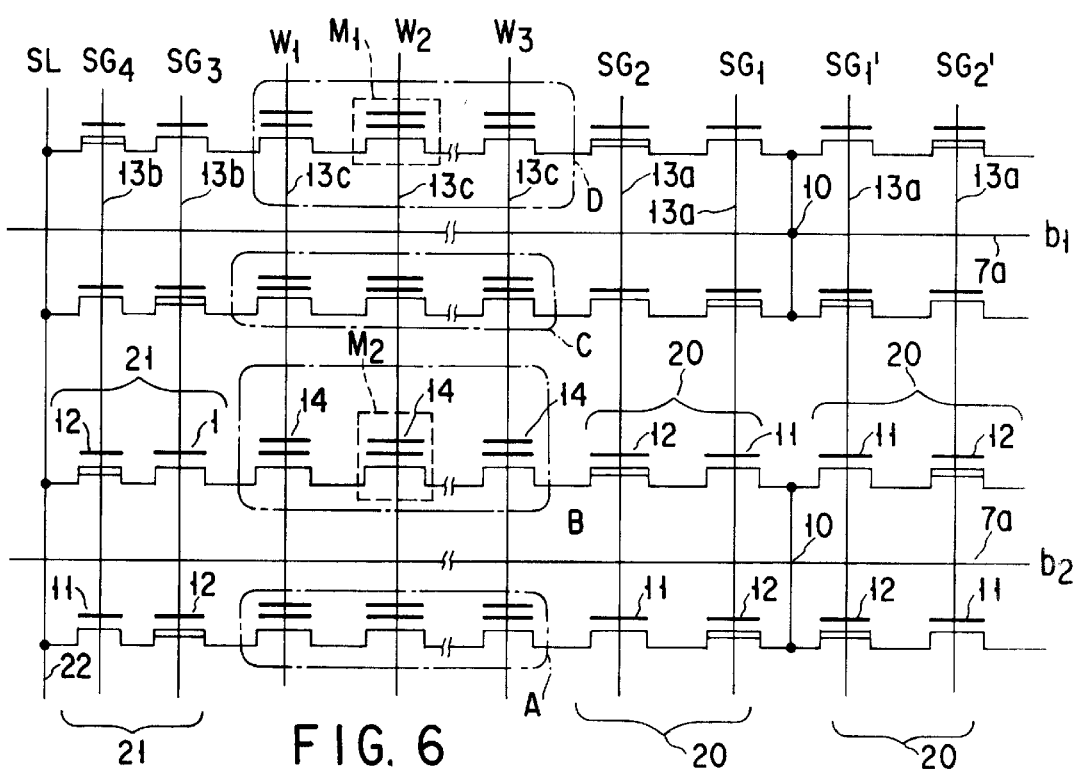
FIG. 6 is a view showing the circuit arrangement for explaining a detailed operation of the embodiment.

Referring to FIG. 6, reference symbol SL denotes the source line 22; $SG_1$, $SG_2$, $SG_1'$, and $SG_2'$, the word lines 13a of the first selection transistor arrays 20; $SG_3$ and $SG_4$, the word lines 13b of the second selection transistor arrays 21; $W_1$, $W_2$, and $W_3$, the word lines 13c of the cell transistors 14. Although erase, write, and read operations performed when the p-type well 1b is formed on an n-type substrate 1a will be described below, when an n-type well 1b is formed on a p-type substrate 1a, the operations can be preferably performed such that the signs of the following voltages are reversed.

The erase operation will now be described below.

A high program voltage VPP(E) of about 12 to 24 V is applied to the n-type substrate 1a and the p-type well 1b. The word lines 13c indicated by $W_1$, $W_2$, and $W_3$ coupled to the control gates 5a of the memory cell transistors sandwiched by the first and second selection transistor arrays ($SG_1$ and $SG_2$, and $SG_4$ and $SG_3$ in FIG. 6) are set to be 0 V. In this manner, in each memory transistor block or array (A, B, C, D, . . . ) sandwiched by the first and second selection transistor arrays, tunnel electrons flow from the floating gate 4a to the source/drain diffusion layer 3 and a channel portion, and a threshold voltage becomes lower than 0 V, thereby completing the erase operation.

In a block not to be subjected to erasure, the word line 13 coupled to the control gates 5a of the memory transistors is set to be a potential equal to that of the p-type well 1b. In this manner, the block is not erased. A potential set to be a value between 0 V and $v_{PP(E)}$ is applied to the word lines 13a and 13b coupled to the gates 4b of all the selection transistor arrays arranged in one p-type well 1b. A bit line 7c and the source line 22 are set in a floating state during the erase operation.

A write operation will now be described below. Data "0" and data "1" are to be simultaneously written in a cell $M_1$ and a cell $M_2$, respectively. In this case, the data "1" defines that the threshold voltage of the cell transistor is lower than 0 V, and the data "0" defines that the threshold voltage of the cell transistor is higher than 0 V.

In a write operation, a voltage of 0 V is applied to a bit line b1 of the bit lines 7a, a program voltage $V_{PP(W)}$ of about 12 to 23 V is coupled to the word line $W_2$ of the word lines 13c, and a potential (intermediate potential $V_M$) set to be a value between the voltage of 0 V and the program voltage $V_{PP(W)}$ is applied to the word lines $SG_4$ and $SG_1$ of the word lines 13b and 13a, respectively, and a voltage of 0 V is applied to the word lines $SG_3$ and $SG_2$, and $SG_1'$ and $SG_2'$ of the word lines 13b and 13a. More specifically, in this manner, the E-type transistors 11 coupled to the word lines $SG_4$ and $SG_1$ of the word lines 13b and 13a are set in an ON state, and the E-type transistors 11 coupled to the word lines $SG_2$ and $SG_3$ are set in an OFF state. The D-type transistors 12 are set in an ON state regardless of their gate voltages.

The potential of 0 V of the bit line b1 of the bit lines 7a is transferred, through the first selection transistor arrays coupled to the word line $SG_1$ of the word lines 13a, to the source/drain diffusion layer 3 of the memory transistor array D of the memory transistor array coupled to the bit line b1 of the bit lines 7a. At this time, since the second selection transistor arrays coupled to the word line $SG_3$ of the word lines 13b are set in an OFF state, the potential $V_M$ of the source line 22 is not transferred to the memory transistor array D. In the memory transistor $M_1$, since the control gate 5a and the source/drain diffusion layer 3 are set to be $V_{PP(W)}$ and 0 V, respectively, tunnel electrodes are injected from the source/drain diffusion layer 3 and the channel portion into the floating gate 4a. The threshold voltage becomes higher than 0 V, and data "0" is written.

In the memory transistor array B, as in the memory transistor array D, the potential of the bit line b2 of the bit lines 7a is transferred, and the potential of the source line 22 is interrupted. A potential $V_M$ is applied to the bit line b2 of the bit lines 7a, and a potential $V_M$ is applied to the source/drain diffusion layer 3 of the memory transistor $M_2$. Although a potential $V_{PP(W)}$ is applied to the control gate 5a, since the source/drain diffusion layer 3 is set to be $V_M$, the electric field of the gate oxide film 15a is not stronger than that of the memory transistor $M_1$. The threshold voltage rarely changes from the threshold voltage obtained in an erase operation and is kept at 0 V or less, and data "1" is written.

As described above, when a write operation is to be selectively performed in the memory transistor arrays D and B, the potential $V_M$ is applied to the word line $SG_1$ of the word lines 13a to turn on the word line $SG_1$. The potential of the bit line 7a is transferred, and the word line $SG_3$ of the word lines 13b is set to be 0 V so as to be decoupled from the source line 22. A potential of 0 V is applied to the bit line 7a coupled to a memory transistor in which data "0" is to be written, and the potential $V_M$ is applied to the bit line 7a coupled to a memory transistor in which data "1" is to be written.

The potential of the bit lines 7a is not transferred to the source/drain diffusion layers of the memory transistor arrays C and A coupled to the bit lines b1 and b2 of the bit lines 7a because the word line $SG_2$ is set to be 0 V and decoupled by the first selection transistor arrays. In contrast to this, since the potential $V_M$ is applied to the word line $SG_4$ of the word lines 13b, the second selection transistor arrays are turned on, and the potential $V_M$ of the source line $V_M$ is transferred.

In the memory transistor arrays A and B, although the potential $V_{PP(W)}$ is applied to the control gate of the memory transistors coupled to the word line $W_2$ of the word lines 13c, the electric field of the gate oxide film 15a is made weaker than that of the memory transistor $M_1$ because the potential $V_M$ is transferred to the source/drain diffusion layer 3. In this manner, a threshold voltage rarely changes from the threshold voltage obtained in an erase operation until the write operation of the memory transistor $M_1$ is finished, and the threshold voltage is kept at 0 V or less.

In a conventional technique, the source/drain diffusion layer 3 of non-selected memory cells (the memory cell transistors coupled to the word line $W_2$ of the word lines 13c in the arrays C and A) is set in a floating state, electrons generated on the substrate side are injected into the floating gate, and an erroneous write operation may be performed. In contrast to this, according to this embodiment, since the source/drain diffusion layer 3 is coupled to the source line 22, the source/drain diffusion layer 3 is not set in a floating state and set to be a potential close to the potential $V_{PP(W)}$, and an erroneous write operation can be prevented.

In the memory transistor arrays D and B, after a write operation is completed in the memory transistors $M_1$ and $M_2$, a write operation is performed for the memory cell transistors coupled to the word line $W_2$ of the word lines 13c in the memory cell transistor arrays C and A. At this time, the potential $V_M$ is applied to the word lines $SC_2$ and $SG_3$ of the word lines 13a and 13b, and a potential of 0 V is applied to the word lines $SG_4$ and $SG_1$, and $SG_1'$ and $SG_2'$. In this manner, the potential of the bit lines 7a is transferred to the memory transistor arrays C and A, and the transistor arrays C and A are decoupled from the source line 22. In contrast to this, the memory transistor arrays D and B are decoupled from the bit lines 7a, and the potential $V_M$ of the source line 22 is transferred to the memory transistor arrays D and B.

The write operation is performed twice as described above to perform a write operation for all the memory transistors coupled to one of the word lines 13. At this time, in a memory transistor block or array (A, B, C, D, . . . ), since only the potential $V_M$ is applied to the word lines 13c ($W_1$, $W_2$, . . . ) coupled to the memory cell transistors except for the word line $W_2$, the threshold voltages of the memory transistors except for the memory transistors coupled to the word line $W_2$ do not change. The potential of one of the remaining word lines 13c of other memory transistor blocks is fixed to 0 V.

A read operation will now be described below.

In the read operation, as in the write operation, when a read operation is to be performed for the memory transistor arrays D and B, the transistor arrays C and A are decoupled from the bit line 7c using the first selection transistor arrays 20, and only the memory transistor arrays D and B are coupled to the bit line 7a.

More specifically, when data are to be selectively read from the memory transistors $M_1$ and $M_2$ at once, a given positive voltage is applied to all the bit lines 7a and the word lines $SG_1$ and $SG_3$ of the word lines 13a and 13b. In addition, the given positive voltage is applied to, of the word lines 13c coupled to the cell transistor arrays A to D, the word lines 13c ($W_1$ and $W_3$) except for the word line $W_2$. In the cell array, a potential of 0 V is applied to all the remaining word lines 13c and the source line 22.

When data "1" is set in the cell transistor $M_1$ or $M_2$, the cell transistor $M_1$ or $M_2$ is turned on to cause a current to flow from the bit lines b1 and b2 of the bit lines 7a to the source line 22. On the other hand, when data "0" is set in the cell transistor $M_1$ or $M_2$, the cell transistor $M_1$ or $M_2$ is not turned on to cause a current to flow because the word line $W_2$ is set to be 0 V. The above difference is detected by a sense amplifier.

When data are to be read from the memory transistor arrays C and A, a given positive voltage is applied to the word lines $SG_2$ and $SG_4$ of the word lines 13a and 13b to turn on the E-type transistors 11, and the bit lines b1 and b2 of the bit lines 7a are coupled to the source line 22. The word lines $SG_3$ and $SG_1$ of the word lines 13b and 13a are set to be 0 V, and the memory transistor arrays D and B are set to be 0 V, thereby disconnecting the memory transistor arrays D and B from the bit line 7a and the source line 22.

In the read operation, assuming that the memory transistor arrays D and B are selected, a given positive voltage is applied to the two word lines $SG_4$ and $SG_3$ of the word lines 13b coupled to the second selection transistor arrays 21 to turn on the E-type transistors 11 due to the following reason. That is, since the memory transistor arrays A and C are decoupled from the E-type transistors 11 coupled to the word line $SG_2$ of the word lines 13a, no current flows from the bit lines 7a to the source line 22 through the memory transistor arrays A or C.

Figure 7A:
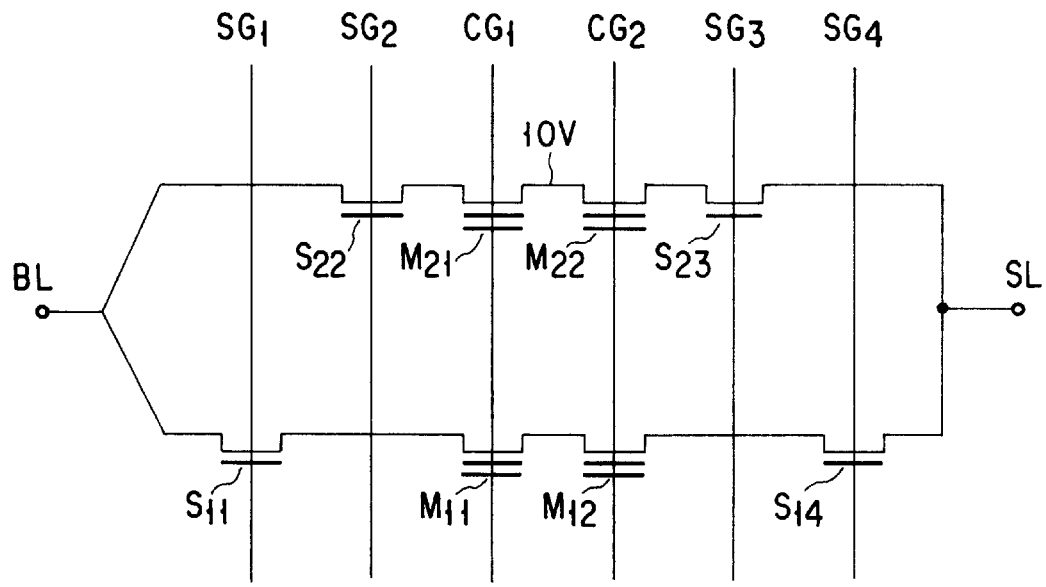
FIGS. 7A and 7B are views for explaining modifications of the present invention.

The present invention is not limited to the above embodiment. In the above embodiment, although selection transistor arrays are obtained by connecting E-type transistors and D-type transistors in series with each other, the D-type transistors may be omitted, as shown in FIG. 7A. In this case, a NAND cell can be selected from a pair of NAND cells by only the control of the E-type transistors.

Figure 7B:
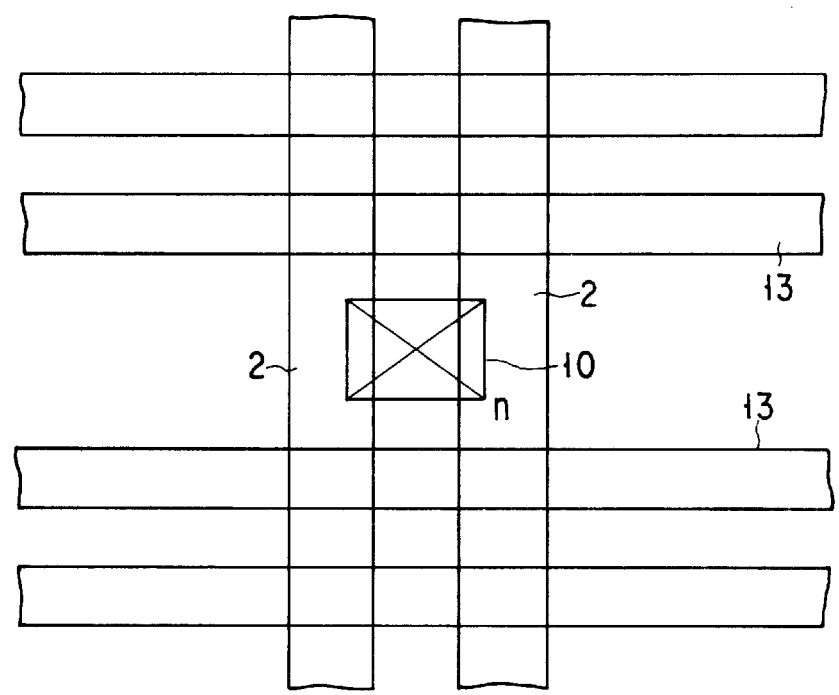

As shown in FIG. 7B, in a structure having drain diffusion layers 2 of a contact portion arranged in the form of stripes and a pair of NAND cells which are separated from each other, a contact hole 10 may be formed across the drain diffusion layers 2. In addition, after the contact hole 10 is formed, an impurity of a conductivity type which is the same as that of the drain diffusion layers 2 may be implanted in the contact hole 10 portion to connect two stripe drain diffusion layers 2 to each other at the contact hole 10 portion.

In this embodiment, although the two first selection transistor arrays 20 and the two second selection transistor arrays 21 are arranged, each of the selection transistor arrays may be arranged in four arrays to make the number of the bit lines 7a to be half. That is, in the embodiment in FIG. 6, one bit line 7a is arranged for the cell transistor arrays A, B, C, and D. When one bit line 7a is arranged for four cell transistor arrays, the line width of each bit line can be more increased, and an interval between the bit lines can be more increased. Write, erase, and read operations are performed in the same analogy as that of the embodiment described above.

According to this embodiment, in a method of manufacturing a semiconductor memory device, the gates 4b of the first and second selection transistor arrays 20 and 21 consist of the first polysilicon film 16, and the second polysilicon film 18 is stacked on the first polysilicon film 16. However, as another method of manufacturing a semiconductor memory device, a method of removing the second polysilicon film from the first polysilicon film 16 or a method of removing the first polysilicon film 16 from the selection transistor region to use the second polysilicon film 18 as the gates 4b may be used.

As each memory cell constituting a NAND cell is not limited to a memory cell using a floating gate, a memory cell having a charge accumulation layer can be applied to the NAND cell. In addition, the number of memory cells constituting the NAND cell is not limited to two or three, and the number of memory cells can be changed depending on specifications.

Various changes and modifications may be effected without departing from the spirit and scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device comprising:

a plurality of NAND memory cells each having first and second terminals and constituted by connecting a plurality of memory cells each having a control gate in series with each other, said NAND memory cells including adjacent first and second NAND memory cells;

bit lines commonly used for NAND memory sets each constituted by at least said first and second NAND memory cells of said NAND memory cells, said bit lines being coupled to the first terminals of said NAND memory cells;

source lines commonly used for the NAND memory sets each constituted by at least said first and second NAND memory cells of said NAND memory cells, said source lines being coupled to the second terminals of said NAND memory cells;

first selection transistors arranged between the first terminal of the first NAND memory cell and said bit line;

second selection transistors arranged between the first terminal of said second NAND memory cell and said bit line;

third selection transistors arranged between the second terminal of the first NAND memory cell and said source line;

fourth selection transistors arranged between the second terminal of said second NAND memory cell and said source line;

a first control gate line coupled to at least control gates of said first selection transistors;

a second control gate line coupled to at least control gates of said second selection transistors;

a third control gate line coupled to at least control gates of said third selection transistors;

a fourth control gate line coupled to at least control gates of said fourth selection transistors.

2. A device according to claim 1, wherein each of said first and second selection transistors includes first and second drain layers arranged parallel to each other and which further comprising a bit line contact formed across said first and second drain layers and coupled to said first and second drain layers.

3. A device according to claim 1, further comprising:

potential applying means including control gate potential applying means for setting a potential of the gate of said memory cell in which data is to be written to be a first potential, bit line potential applying means for setting a potential of said bit line to be any one of a second potential lower than the first potential or a third potential lower than the second potential in accordance with the data to be written, and source line potential applying means for setting potentials of said source lines to be said second potential between the first potential and the third potential, when data is to be written in a memory cell; and means for, when data is to be written in a memory cell included in said first NAND memory cell, turning on said first and fourth selection transistors and turning off said second and third selection transistors, and for, when data is to be written in a memory cell included in said second NAND memory cell, turning on said second and third selection transistors and turning off said first and fourth selection transistors.

4. A device according to claim 1, further comprising:

potential applying means including control gate potential applying means for setting a potential of the gate of said memory cell in which data is to be written to be a first potential, bit line potential applying means for setting a potential of said bit line to be any one of a second potential lower than the first potential or a third potential lower than the second potential in accordance with the data to be written, and source line potential applying means for setting potentials of said source lines to be said second potential between the first potential and the third potential, when data is to be written in a memory cell; and means for, when data is to be written in a memory cell included in said first NAND memory cell, turning off said first and fourth selection transistors and turning on said second and third selection transistors, and for, when data is to be written in a memory cell included in said second NAND memory cell, turning off said second and third selection transistors and turning on said first and fourth selection transistors.

5. A device according to claim 3, wherein said first and second selection transistors include first and second drain layers, respectively, said first and second drain layers being arranged parallel to each other and which further comprising a bit line contact formed across said first and second drain layers and coupled to said first and second drain layers.

6. A device according to claim 1, wherein one of said first and second selection transistors is an enhancement transistor and one of said third and fourth selection transistors is an enhancement transistor.

7. A device according to claim 6, further comprising:

potential applying means including control gate potential applying means for setting a potential of the gate of said memory cell in which data is to be written to be a first potential, bit line potential applying means for setting a potential of said bit line to be any one of a second potential lower than the first potential or a third potential lower than the second potential in accordance with the data to be written, and source line potential applying means for setting potentials of said source lines to be said second potential between the first potential and the third potential, when data is to be written in a memory cell; and means for, when data is to be written in a memory cell included in said first NAND memory cell, turning on said first and fourth selection transistors and turning off said second and third selection transistors, and for, when data is to be written in a memory cell included in said second NAND memory cell, turning on said second and third selection transistors and turning off said first and fourth selection transistors.

8. A device according to claim 6, further comprising:

potential applying means including control gate potential applying means for setting a potential of the gate of said memory cell in which data is to be written to be a first potential, bit line potential applying means for setting a potential of said bit line to be any one of a second potential lower than the first potential or a third potential lower than the second potential in accordance with the data to be written, and source line potential applying means for setting potentials of said source lines to be said second potential between the first potential and the third potential, when data is to be written in a memory cell; and means for, when data is to be written in a memory cell included in said first NAND memory cell, turning off said first and fourth selection transistors and turning on said second and third selection transistors, and for, when data is to be written in a memory cell included in said second NAND memory cell, turning off said second and third selection transistors and turning on said first and fourth selection transistors.

9. A device according to claim 7, wherein said first and second selection transistors include first and second drain layers, respectively, said first and second drain layers being arranged parallel to each other and which further comprising a bit line contact formed across said first and second drain layers and coupled to said first and second drain layers.

10. A device according to claim 1, wherein each of said first to fourth selection transistors includes an enhancement transistor and a depletion transistor which are coupled in series with each other;

said first control gate line is coupled to a control gate of said enhancement transistor of said first selection transistors and a control gate of said depletion transistor of said second selection transistors;

said second control gate line is coupled to a control gate of said enhancement transistor of said second selection transistors and a control gate of said depletion transistor of said first selection transistors;

said third control gate line is coupled to a control gate of said enhancement transistor of said third selection transistors and a control gate of said depletion transistor of said fourth selection transistors; and said fourth control gate line is coupled to a control gate of said enhancement transistor of said fourth selection transistors and a control gate of said depletion transistor of said third selection transistors.

11. A device according to claim 10, wherein said first and second selection transistors include first and second drain layers, respectively, said first and second drain layers being arranged parallel to each other and which further comprising a bit line contact formed across said first and second drain layers and coupled to said first and second drain layers.

12. A device according to claim 10, further comprising:

potential applying means including control gate potential applying means for setting a potential of the gate of said memory cell in which data is to be written to be a first potential, bit line potential applying means for setting a potential of said bit line to be any one of a second potential lower than the first potential or a third potential lower than the second potential in accordance with the data to be written, and source line potential applying means for setting potentials of said source lines to be said second potential between the first potential and the third potential, when data is to be written in a memory cell; and means for, when data is to be written in a memory cell included in said first NAND memory cell, turning on said first and fourth selection transistors and turning off said second and third selection transistors, and for, when data is to be written in a memory cell included in said second NAND memory cell, turning on said second and third selection transistors and turning off said first and fourth selection transistors.

13. A device according to claim 12, wherein said first and second selection transistors include first and second drain layers, respectively, said first and second drain layers being arranged parallel to each other and which further comprising a bit line contact formed across said first and second drain layers and coupled to said first and second drain layers.

14. A nonvolatile semiconductor memory device comprising:

a plurality of NAND memory cells each having first and second terminals and constituted by connecting a plurality of memory cells each having a control gate in series with each other, said NAND memory cells including adjacent first and second NAND memory cells;

bit lines commonly used for NAND memory sets each constituted by at least said first and second NAND memory cells of said NAND memory cells, said bit lines being coupled to the first terminals of said NAND memory cells connected in series;

source lines commonly used for the NAND memory sets each constituted by at least said first and second NAND memory cells of said NAND memory cells, said source lines being coupled to the second terminals of said NAND memory cells connected in series;

first selecting means arranged between the first terminals of said first and second NAND memory cells and said bit line; and second selecting means arranged between the second terminals of said first and second NAND memory cells and said source line;

wherein said first selecting means include enhancement transistors and depletion transistors which are coupled in series with each other, and an order of connection of said enhancement transistors and said depletion transistors to the first terminals of said first and second NAND memory cells are reversed to each other, and said second selecting means include enhancement transistors and depletion transistors which are coupled in series with each other, and an order of connection of said enhancement transistors and said depletion transistors to the second terminals of said first and second NAND memory cells are reversed to each other.

15. A device according to claim 14, further comprising:

means for, when data is to be written in a memory cell, setting a potential of the gate of said memory cell in which data is to be written to be a first potential, setting a potential of said bit line to be any one of a second potential lower than the first potential or a third potential lower than the second potential in accordance with the data to be written, and setting potentials of said source lines to be said second potential between the first potential and the third potential; and means for, when data is to be written in a memory cell included in said first NAND memory cells, turning on said first selecting means coupled to said first NAND memory cell and said second selecting means coupled to said second NAND memory cell and turning off said first selecting means coupled to said second NAND memory cell and said second selecting means coupled to said first NAND memory cell, and for, when data is to be written in a memory cell included in said second NAND memory cells, turning off said first selecting means coupled to said first NAND memory cell and said second selecting means coupled to said second NAND memory cell and turning on said first selecting means coupled to said second NAND memory cell and said second selecting means coupled to said first NAND memory cell.

16. A device according to claim 15, wherein said first and second selecting means include first and second drain layers, respectively, said first and second drain layers being arranged parallel to each other and which further comprising a bit line contact formed across said first and second drain layers and coupled to said first and second drain layers.

* * * * *